United States Patent
Turney et al.

(10) Patent No.: US 10,506,735 B2
(45) Date of Patent: Dec. 10, 2019

(54) HEAT EXCHANGE DEVICE IN DIRECTED FLOW SYSTEM

(71) Applicant: Hamilton Sundstrand Corporation, Windsor Locks, CT (US)

(72) Inventors: Joseph Turney, Amston, CT (US); Brian St. Rock, Andover, CT (US); John H. Whiton, South Windsor, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 560 days.

(21) Appl. No.: 14/467,786

(22) Filed: Aug. 25, 2014

(65) Prior Publication Data

US 2016/0057890 A1 Feb. 25, 2016

(51) Int. Cl.
*F24H 3/02* (2006.01)
*H05K 7/20* (2006.01)

(52) U.S. Cl.
CPC .............................. *H05K 7/20145* (2013.01)

(58) Field of Classification Search
CPC .. H05K 7/20; H05K 7/20163; H05K 7/20172; H05K 7/202; H05K 7/20145; H05K 7/20409; H01L 23/467; H01L 2924/0002; F28D 2021/0029; F28D 2021/0028; F28F 2250/00
See application file for complete search history.

(56) References Cited

U.S. PATENT DOCUMENTS

| 4,733,293 | A | 4/1988 | Gabuzda |
| 6,015,008 | A | 1/2000 | Kogure et al. |
| 9,367,101 | B2 * | 6/2016 | MacDonald ........ F04D 25/0613 |
| 2002/0079086 | A1 | 6/2002 | Huang et al. |
| 2004/0095722 | A1 | 5/2004 | Rong-Yao |
| 2005/0036288 | A1 | 2/2005 | Shen et al. |
| 2006/0056994 | A1 * | 3/2006 | Van Lear ................ F04D 25/04 |
|  |  |  | 417/407 |
| 2008/0218972 | A1 | 9/2008 | Sauciue et al. |
| 2009/0263232 | A1 * | 10/2009 | Jarrah ................. F04D 25/0613 |
|  |  |  | 415/4.4 |

(Continued)

FOREIGN PATENT DOCUMENTS

| JP | H08255855 A | 10/1996 |
| WO | WO03105224 A2 | 12/2003 |

(Continued)

OTHER PUBLICATIONS

Extended European Search Report for European Application No. 15173821.8, dated Mar. 17, 2016, 9 pages.

(Continued)

*Primary Examiner* — Henry T Crenshaw
*Assistant Examiner* — Kamran Tavakoldavani
(74) *Attorney, Agent, or Firm* — Kinney & Lange, PA

(57) ABSTRACT

A method of cooling a component with a heat exchange device includes pulling air into a central airway in a heat exchange device using a blower; directing the air from the blower through a diffuser and across a heat sink base, wherein a first component positioned underneath the heat sink base is cooled when the air passes over the heat sink base; and directing the air out from the diffuser and across a second component to cool the second component.

12 Claims, 7 Drawing Sheets

(56) References Cited

U.S. PATENT DOCUMENTS

| | | | |
|---|---|---|---|
| 2010/0170657 A1* | 7/2010 | Kaslusky | H01L 23/467 165/80.3 |
| 2011/0110774 A1* | 5/2011 | Horng | F04D 29/4246 415/208.1 |
| 2012/0087088 A1* | 4/2012 | Killion | F28D 15/0266 361/697 |
| 2014/0092556 A1 | 4/2014 | Turney et al. | |
| 2014/0190184 A1* | 7/2014 | Mahajan | F25B 21/02 62/3.2 |
| 2014/0233177 A1* | 8/2014 | Weidner | G06F 1/20 361/679.48 |
| 2016/0014928 A1* | 1/2016 | Sakamoto | G06F 1/20 361/696 |
| 2016/0066478 A1* | 3/2016 | Van Den Bergen | G03F 7/70991 361/679.47 |

FOREIGN PATENT DOCUMENTS

| | | |
|---|---|---|
| WO | WO2012011957 A2 | 1/2012 |
| WO | WO2014066290 A1 | 5/2014 |

OTHER PUBLICATIONS

European Examination Report for European Patent Application No. 15173821.8, dated Apr. 18, 2019, 7 pages.

\* cited by examiner

US 10,506,735 B2

HEAT EXCHANGE DEVICE IN DIRECTED FLOW SYSTEM

STATEMENT OF GOVERNMENT INTEREST

The U.S. Government has a paid-up license in this invention and the right in limited circumstances to require the patent owner to license others on reasonable terms as provided for by the terms of Contract No. W31P4Q-09-C-0067 awarded by the United States Army and the Defense Advanced Research Projects Agency (DARPA).

BACKGROUND

The present invention relates to air-cooled heat exchange systems, and in particular, to a heat exchange device used in directed flow systems.

In recent years, many electronic components have undergone tremendous technological innovation. With the technological innovation comes improved performance and increased power consumption of the electronic components. These innovative electronic components generate higher heat than conventional electronic components. To dissipate heat generated in the electronic components, air-cooled heat exchange systems can be used. But the technology, design, and performance of air-cooled heat exchange systems have lagged behind. As more heat dissipation is needed with new electronic components, air-cooled heat exchange systems have grown in size, weight, complexity, and cost to accommodate for the higher heat dissipation that is needed. In some instances, these conventional air-cooled heat exchange systems are inadequate.

Further, multiple electronic components are often used in new devices, thus requiring better heat dissipation at multiple points in the device. Conventional means of cooling multiple electronic components in a system include the following. First, a heat sink and fan combination is located at every electronic component to cool that particular electronic component. This adds additional weight, cost, size, and complexity to electronic systems. Second, a heat sink is located at every electronic component but only one or a few fans are positioned in the electronic system to blow air over the entire electronic system. This adds an increase in the size and power of the fan. Additionally, it is less effective in instances where the electronic components in the electronic system are generating a large amount of heat, as the air flows over the entire electronic system and not just over the electronic components that are generating high heat.

SUMMARY

A method of cooling a component with a heat exchange device includes pulling air into a central airway in a heat exchange device using a blower. The air is then directed from the blower through a diffuser and across a heat sink base, wherein a first component positioned underneath the heat sink base is cooled when the air passes over the heat sink base. The air is then directed out from the diffuser and across a second component to cool the second component.

A system for cooling electronic components includes a heat exchange device and a structure positioned adjacent the heat exchange device that is configured to direct air flowing out of the heat exchange device over electronic components to cool the electronic components. The heat exchange device includes a blower for pulling fluid into the first heat exchange device, a heat sink base, and a diffuser positioned between the blower and the heat sink base to receive the fluid from the blower. The diffuser has a first plurality of vanes that form fluid flow channels extending spirally outward.

DETAILED DESCRIPTION

In general, the present invention relates to using a heat exchange device used in directed flow systems. A heat exchange device known in the art includes a blower, a diffuser, and a heat sink base that can be positioned on an electronic component. The heat exchange device is capable of high performance for its weight, volume, and power consumption. The present disclosure comprises directing the fluid that is exiting the heat exchange device towards another electronic component to exchange heat with that electronic component. This can include (1) transferring the fluid through a plenum to cool an electronic component positioned at a second end of the plenum; (2) transferring the fluid through a plenum and into a heat exchanger before using the fluid to cool an electronic component positioned adjacent the heat exchanger; or (3) directing the fluid with walls, ducts, or channels towards electronic components positioned away from the heat exchange device. Further, the heat exchange device can be used in a closed-loop system in an enclosure. Fluid that exits the heat exchange device can flow through the enclosure and exchange heat with other components before being directed back through the heat exchange device. Further, a heat exchanger can be positioned outside of the enclosure to cool the fluid in the enclosure before the fluid is directed back to the heat exchange device. Using the heat exchange device in directed flow systems allows the fluid exiting the heat exchange device to be used to exchange heat with other electronic components in the system.

Figure 1A:
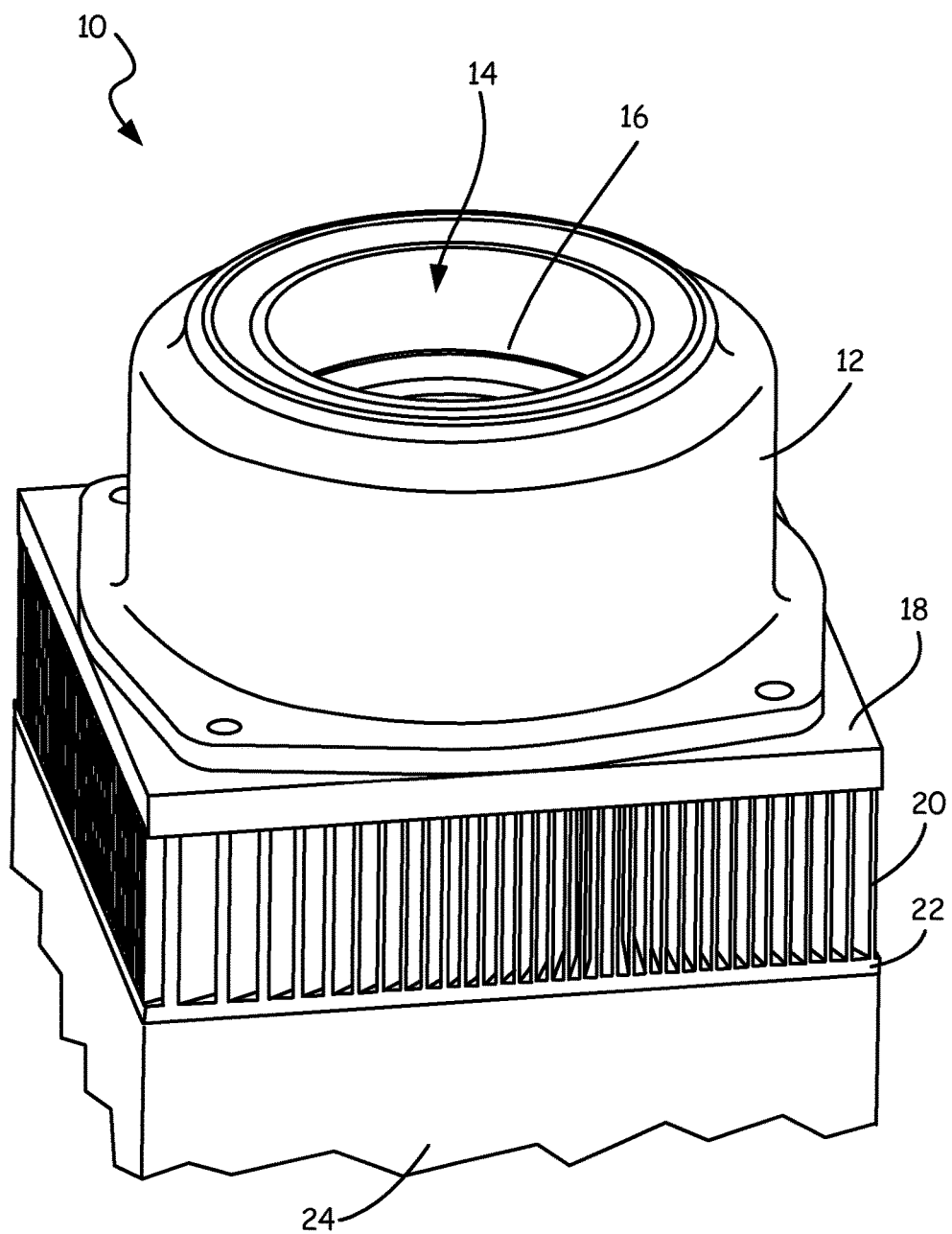
FIG. 1A is a perspective view of a prior art heat exchange device.
Figure 1B:
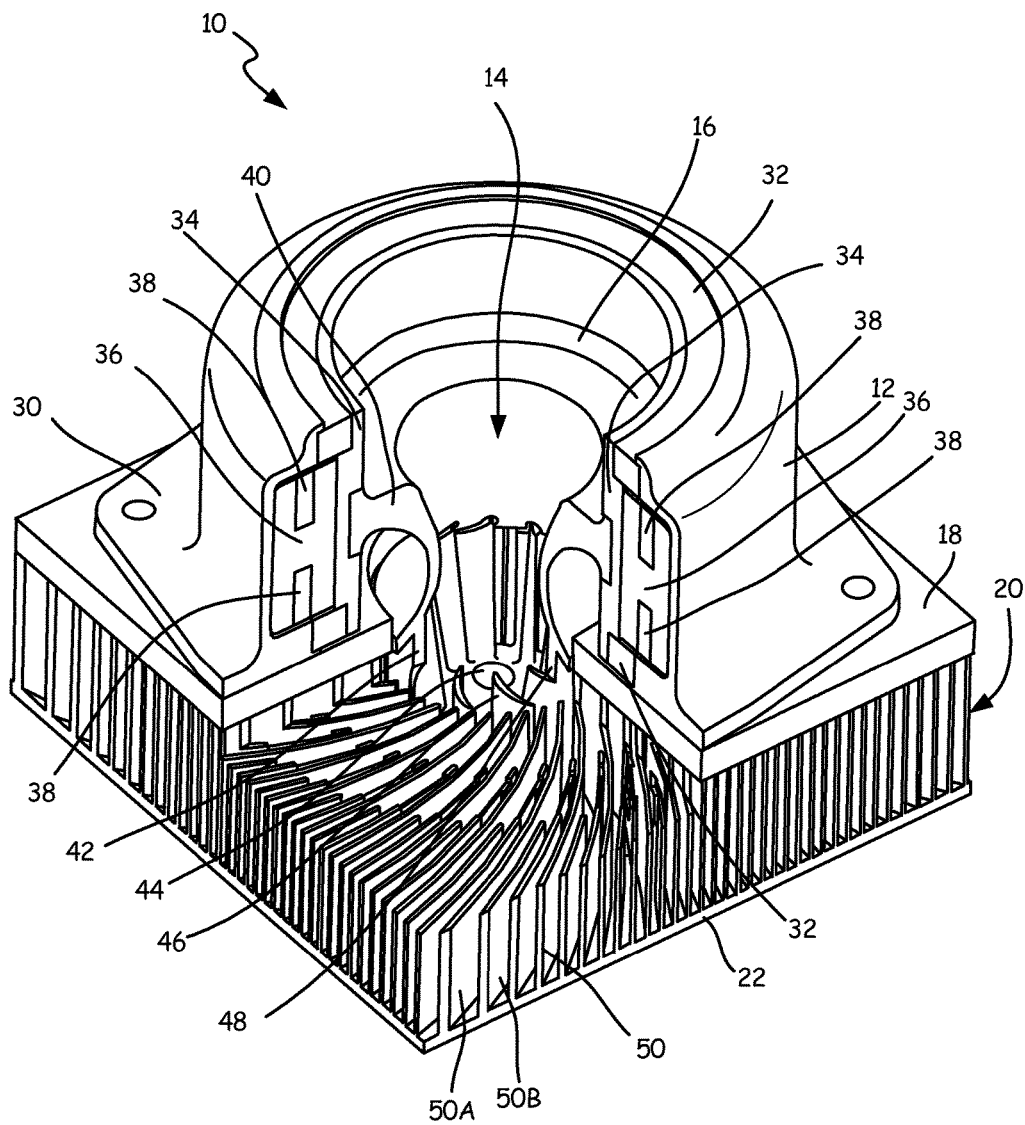
FIG. 1B is a partially cut away perspective view of the prior art heat exchange device seen in FIG. 1A.

FIG. 1A is a perspective view of prior art heat exchange device 10. FIG. 1B is a partially cut away perspective view of prior art heat exchange device 10 seen in FIG. 1A. Heat exchange device 10 includes motor 12, central airway 14, blower 16, cover 18, diffuser 20, and heat sink base 22. Also shown in FIG. 1A is electronic component 24.

Motor 12 forms an upper portion of heat exchange device 10. Central airway 14 runs through a central opening in motor 12 and blower 16 is positioned within the central opening in motor 12. Motor 12 and blower 16 are mounted on cover 18. Cover 18 is positioned over diffuser 20 and heat sink base 22. Cover 18 forms a support for motor 12 and blower 16 and a top of diffuser 20 and heat sink base 22. Heat sink base 22 is positioned over electronic component 24. Electronic component 24 can be any electronic component that needs to be cooled. Heat sink base 22 is an integral part of heat exchange device 10 in the embodiment shown in FIGS. 1A-1B, but it can be part of electronic component 24 in alternate embodiments. In FIGS. 1A-1B, diffuser 20 and heat sink base 22 together to form a heat sink.

Motor 12 is shown as an electric motor with central airway 14 around its rotational axis. Motor 12 drives blower 16, which rotates to draw air into heat exchanger device 10 through central airway 14. Air pulled in through central airway 14 with blower 16 is then directed through an aperture in cover 18 into diffuser 20. The air then flows through diffuser 20 and across heat sink base 22 to cool electronic component 24.

The internal components of heat exchange device 10 are shown in FIG. 1B. Motor 12 includes housing 30, bearings 32, rotor 34, stator 36, and stator windings 38. Housing 30 forms an outer body for motor 12. Bearings 32, rotor 34, and stator 36 are positioned in housing 30. Rotor 34 is a permanent magnet rotor in the embodiment shown, and rotor 34 rotates on bearings 32 adjacent to stator 36. Stator windings 38 are positioned to receive electrical power from a power source to drive motor 12.

Blower 16 includes upper hub 40, lower hub 42, center port 44, and blades 46, including upper blade ends 48. Upper hub 40 of blower 16 is connected to rotor 34 of motor 12. As rotor 34 rotates, upper hub 40 will rotate with rotor 34. Upper hub 40 is integrally formed with lower hub 42. Center port 44 is formed in a center portion of blower 16 and allows air to pass through blower 16 into diffuser 20. Blades 46 have upper blade ends 48 that are connected to lower hub 42. Blades 46 pull air into heat exchange device 10 through central airway 14. Blower 16 then pushes the air that has been pulled into blower 16 through central airway 14 radially outward.

Diffuser 20 includes vanes 50. Vanes 50 can be any element that takes air from central passage 14 so that air contacts vanes 50 and heat sink base 22 to transfer heat out of heat exchange device 10 and into the air. Vanes 50 are arranged in a spiral configuration in diffuser 20. Vanes 50 can include a first plurality of vanes 50A and a second plurality of vanes 50B. First plurality of vanes 50A extend from a center of diffuser 20 to an outer edge of diffuser 20. Second plurality of vanes 50B extends from a middle of diffuser 20 to the outer edge of diffuser 20. First plurality of vanes 50A form primary channels through which the air can flow when it enters diffuser 20. Second plurality of vanes 50B are positioned between first plurality of vanes 50A to narrow the channels and further disrupt the air flowing through diffuser 20 to increase heat transfer. Diffuser 20 serves two purposes in heat exchange device 10. First, diffuser 20 receives air from blower 16 and deflects the flow of the air radially outward through vanes 50. Second, vanes 50 in diffuser 20 provide additional heat conductive material in combination with heat sink base 22, so that more hot metal is exposed to the cooling air flow. Vanes 50 are made from heat conductive materials such as metals including aluminum or copper.

Air is pulled down into central airway 14 with blades 46 of blower 16. Blower 16 then pushes the air radially outward. This air passes from blower 16 to diffuser 20 and through channels formed by vanes 50. Heat in vanes 50 and heat sink base 22 transfers into the air as it flows through diffuser 20 to cool electronic component 24. Heat exchange device 10 is compact and yet provides a great increase in the surface area of diffuser 20 and heat sink base 22 through which heat can be exchanged. Air that flows through diffuser 20 and across heat sink base 22 can exit heat exchange device 10 and be expelled into an ambient.

Heat exchange device 10 is a significant improvement over conventional designs that simply direct the air flow axially to impinge on a heat sink. Motor 12, blower 16, diffuser 20 and heat sink base 22 are attached together to form a single device that can be attached to an electronic package such as a circuit board in the same manner that conventional air-cooled heat-exchangers are attached. Heat exchange device 10 is capable of up to ten times reduction in power requirement needed compared to prior art heat exchange devices. Further, heat exchange device 10 is up to four times smaller in volume and weight compared to prior art heat exchange devices. The compact size and increased performance of heat exchange device 10 allows heat exchange device 10 to be used in spaces where conventional heat exchange devices are infeasible.

FIGS. 2A-6B show various embodiments for using heat exchange device 10 in a directed flow system. This includes using heat exchange device 10 in an electronic system and directing air flowing out of heat exchange device 10 through the electronic system to be used for a secondary purpose. The embodiments shown in FIGS. 2A-6B are examples of directed flow systems, but it will be understood by those skilled in the art that various changes may be made and equivalents may be substituted for elements thereof without departing from the scope of the invention.

Figure 2A:
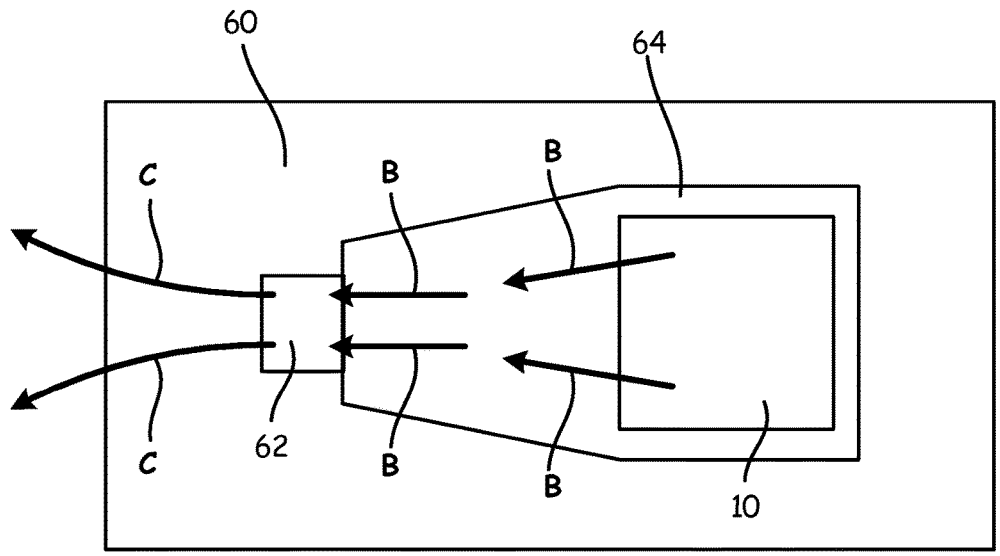
FIG. 2A is schematic top view of a first embodiment of the heat exchange device on an electronic board and connected to a plenum.
Figure 2B:
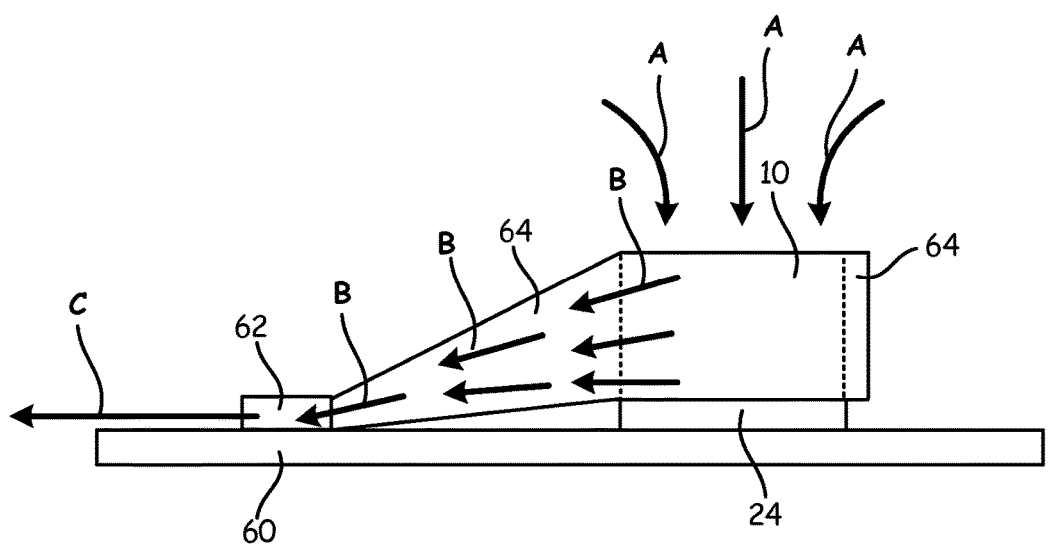
FIG. 2B is a schematic side view of the first embodiment of the heat exchange device.

FIG. 2A is schematic top view of a first embodiment of heat exchange device 10 on electronic board 60 and connected to plenum 64. FIG. 2B is a schematic side view of the first embodiment of heat exchange device 10. FIGS. 2A-2B include heat exchange device 10, electronic component 24, electronic board 60, electronic component 62, and plenum 64. Arrows A, B, and C are also drawn in FIGS. 2A-2B to indicate how air flows through the system.

Heat exchange device 10 is positioned on electronic component 24 to cool electronic component 24. Electronic component 24 is attached to electronic board 60. Electronic component 62 is also attached to electronic board 60 and positioned away from electronic component 24. Plenum 64 extends between heat exchange device 10 and electronic component 62. A first end of plenum 64 surrounds and is attached to heat exchange device 10 to receive all of the air expelled from heat exchange device 10. A second end of plenum 64 is positioned adjacent to electronic component 62 so that air that flow through plenum 64 will flow across and around electronic component 62. Plenum 64 can be any duct, volute, or conduit that can direct air from heat exchange device 10 to electronic component 62.

Heat exchange device 10 is positioned on electronic component 24 so heat from electronic component 24 can transfer into a diffuser and a heat sink plate of heat exchange device 10. Heat exchange device 10 pulls in air with a blower, as shown with arrows A. The air then moves through the diffuser and across the heat sink plate to absorb the heat from electronic component 24. The air is then expelled out of the diffuser of heat exchange device 10 and into plenum 64, as shown with arrows B. Plenum 64 directs the air from the first end to the second end of plenum 64, as shown with arrows B. The air then exits plenum 64 at the second end of plenum 64 and flows over and around electronic component 62, as shown with arrows B. As the air flows over electronic component 62 heat can be exchanged between the air and electronic component 62. The air that flows over electronic component 62 can then be expelled into an ambient, as shown with arrows C.

Figure 3A:
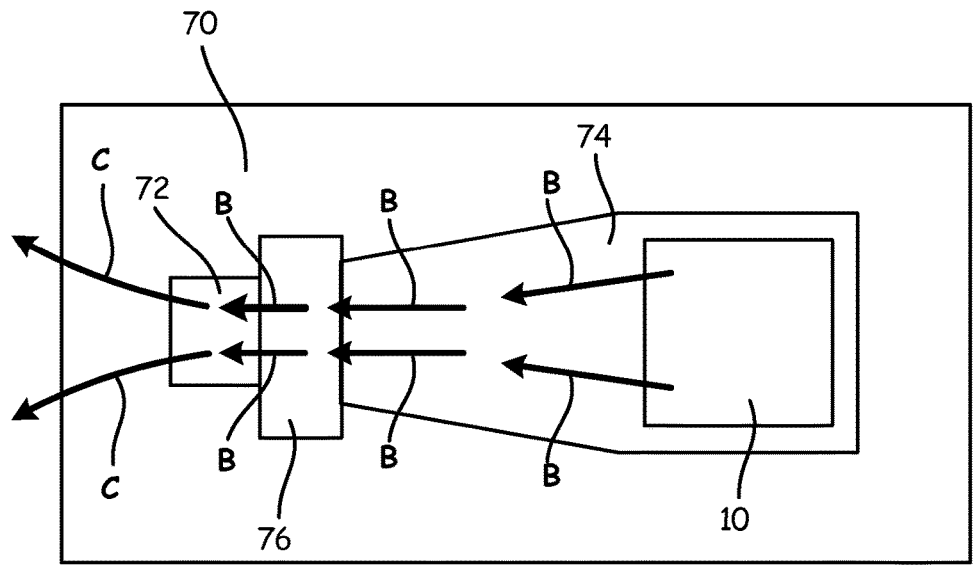
FIG. 3A is a schematic top view of a second embodiment of the heat exchange device on an electronic board and connected to a plenum and a heat exchanger.
Figure 3B:
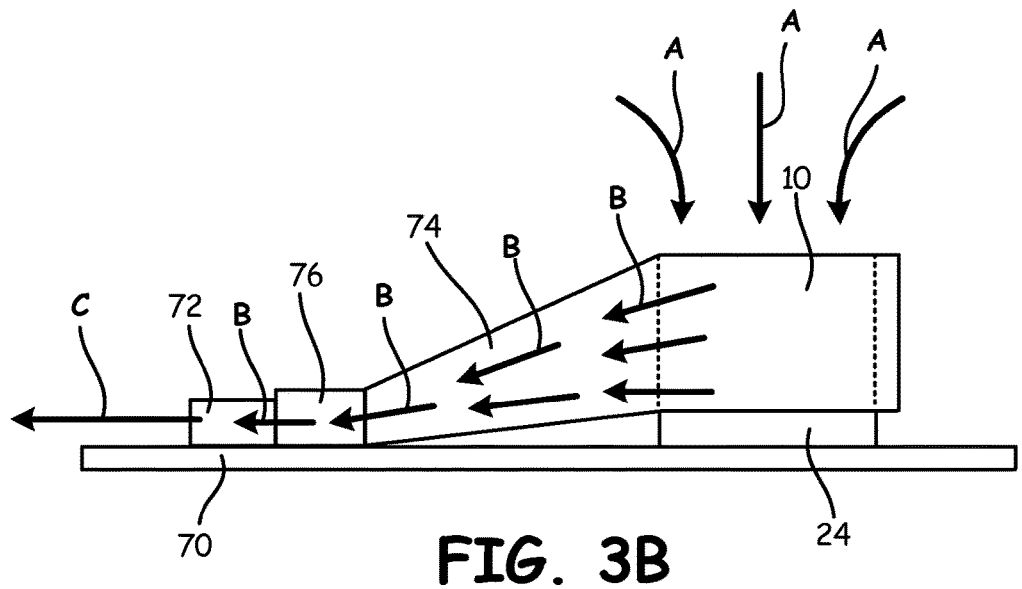
FIG. 3B is a schematic side view of the second embodiment of the heat exchange device.

FIG. 3A is a schematic top view of a second embodiment of heat exchange device 10 on electronic board 70 and connected to plenum 74 and heat exchanger 76. FIG. 3B is a schematic side view of the second embodiment of heat exchange device 10. FIGS. 3A-3B include heat exchange device 10, electronic component 24, electronic board 70, electronic component 72, plenum 74, and heat exchanger 76. Arrows A, B, and C are also drawn in FIGS. 3A-3B to indicate how air flows through the system.

Heat exchange device 10 is positioned on electronic component 24 to cool electronic component 24. Electronic component 24 is attached to electronic board 70. Electronic component 72 is also attached to electronic board 70 and positioned away from electronic component 24. Plenum 74 extends between heat exchange device 10 and heat exchanger 76 that is positioned adjacent to electronic component 72. A first end of plenum 74 surrounds and is attached to heat exchange device 10 to receive all of the air expelled from heat exchange device 10. A second end of plenum 74 is connected to heat exchanger 76 so that air that flows through plenum 74 will flow into heat exchanger 76. Plenum 74 can be any duct, volute, or conduit that can direct air from heat exchange device 10 to heat exchanger 76. Heat exchanger 76 can then cool the air and expel the air so that the air flows across and around electronic component 72.

Heat exchange device 10 is positioned on electronic component 24 so heat from electronic component 24 can transfer into a diffuser and a heat sink plate of heat exchange device 10. Heat exchange device 10 pulls in air with a blower, as shown with arrows A. The air then moves through the diffuser and across the heat sink plate to absorb the heat from electronic component 24. The air is then expelled out of the diffuser of heat exchange device 10 and into plenum 74, as shown with arrows B. Plenum 74 directs the air from the first end to the second end of plenum 74, as shown with arrows B. The air then exits plenum 74 at the second end of plenum 74 and flows into heat exchanger 76, as shown with arrows B. Heat exchanger 76 can then exchange heat with the air to cool or heat the air. The air can then flow out of heat exchanger 76 and over and around electronic component 72, as shown with arrows B. As the air flows over electronic component 72 heat can be exchanged between the air and electronic component 72. The air that flows over electronic component 72 can then be expelled into an ambient, as shown with arrows C.

Figure 4A:
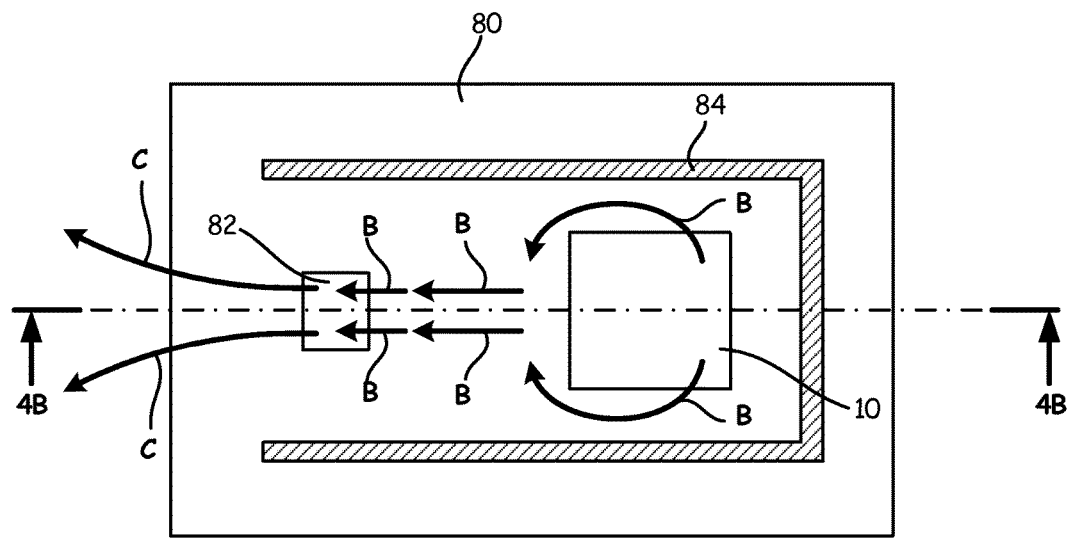
FIG. 4A is a schematic cross-sectional top view of a third embodiment of the heat exchange device on an electronic board with walls surrounding the heat exchange device, taken along line 4A-4A of FIG. 4B.
Figure 4B:
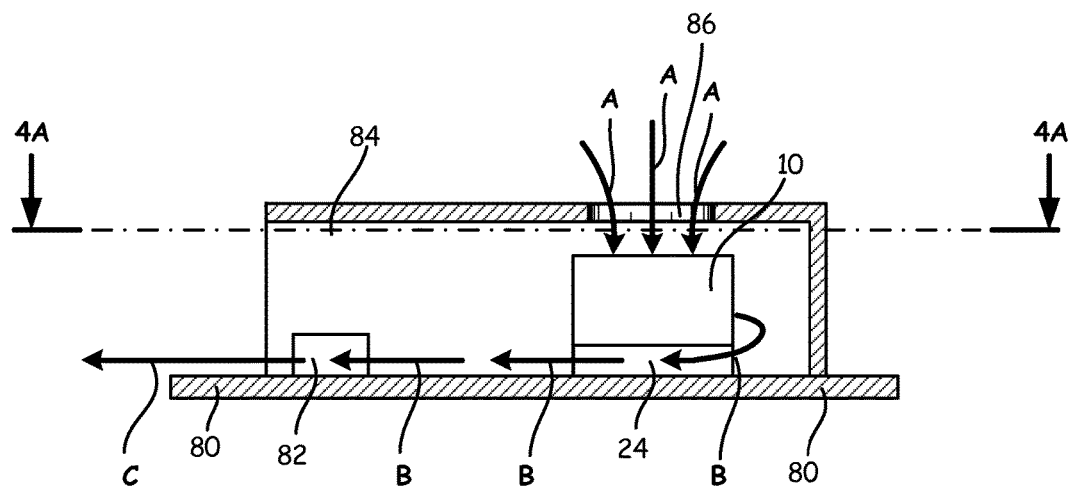
FIG. 4B is a partial schematic cross-sectional side view of the third embodiment of the heat exchange device taken along line 4B-4B of FIG. 4A.

FIG. 4A is a schematic cross-sectional top view of a third embodiment of heat exchange device 10 on electronic board 80 with walls 84 surrounding heat exchange device 10, taken along line 4A-4A of FIG. 4B. FIG. 4B is a partial schematic cross-sectional side view of the third embodiment of heat exchange device 10 taken along line 4B-4B of FIG. 4A. FIGS. 4A-4B include heat exchange device 10, electronic component 24, electronic board 80, electronic component 82, walls 84, and opening 86. Arrows A, B, and C are also drawn in FIGS. 4A-4B to indicate how air flows through the system. Heat exchange device 10, electronic component 24, and electronic component 82 are not shown in section in FIG. 4B.

Heat exchange device 10 is positioned on electronic component 24 to cool electronic component 24. Electronic component 24 is attached to electronic board 80. Electronic component 82 is also attached to electronic board 80 and positioned away from electronic component 24. Walls 84 surround heat exchange device 10 and electronic component 24 on three sides and extend over heat exchange device 10 and electronic component 24. Electronic component 82 is positioned away from heat exchange device 10 on a fourth side so that there is not a wall between electronic component 82 and heat exchange device 10. Walls 84 will direct air that is expelled from heat exchange device 10 towards electronic component 82. Opening 86 extends through a top portion of walls 84 over heat exchange device 10. Air can flow through opening 86 and into heat exchange device 10.

Heat exchange device 10 is positioned on electronic component 24 so heat from electronic component 24 can transfer into a diffuser and a heat sink plate of heat exchange device 10. Heat exchange device 10 pulls in air with a blower through opening 86 in walls 84, as shown with arrows A. The air then moves through the diffuser and across the heat sink plate to absorb the heat from electronic component 24. The air is then expelled out of the diffuser of heat exchange device 10, as shown with arrows B. Air that is expelled out of heat exchange device 10 will be directed with walls 84, as shown with arrows B. Walls 84 will direct the air toward electronic component 82, as shown with arrows B. The air thus flows over and around electronic component 82, as shown with arrows B. As the air flows over electronic component 82 heat can be exchanged between the air and electronic component 82. The air that flows over electronic component 82 can then be expelled into an ambient, as shown with arrows C.

Figure 5A:
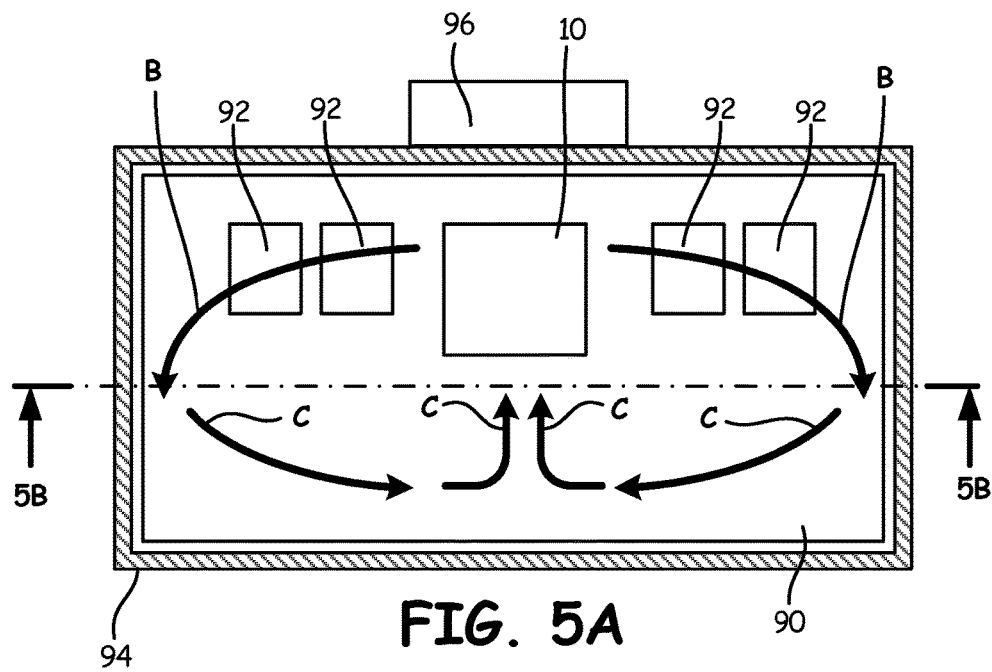
FIG. 5A is a schematic cross-sectional top view of a fourth embodiment of the heat exchange device on an electronic board in an enclosure, taken along line 5A-5A of FIG. 5B.
Figure 5B:
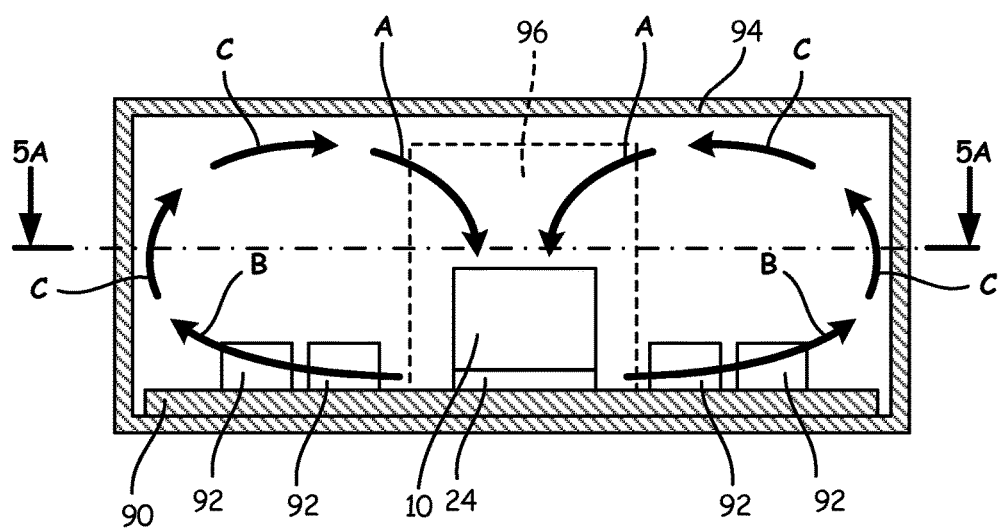
FIG. 5B is a schematic cross-sectional side view of the fourth embodiment of the heat exchange device taken along line 5B-5B of FIG. 5A.

FIG. 5A is a schematic cross-sectional top view of a fourth embodiment of heat exchange device 10 on electronic board 90 in enclosure 94, taken along line 5A-5A of FIG. 5B. FIG. 5B is a schematic cross-sectional side view of the fourth embodiment of heat exchange device 10 taken along line 5B-5B of FIG. 5A. FIGS. 5A-5B include heat exchange device 10, electronic component 24, electronic board 90, electronic components 92, enclosure 94, and heat exchanger 96. Arrows A, B, and C are also drawn in FIGS. 5A-5B to indicate how air flows through the system.

Heat exchange device 10 is positioned on electronic component 24 to cool electronic component 24. Electronic component 24 is attached to electronic board 90. Electronic components 92 are also attached to electronic board 90 and positioned away from electronic component 24. Electronic board 90 with heat exchange device 10, electronic component 24, and electronic components 92 are held in enclosure 94. Enclosure 94 is a housing that does not have any openings so that a fluid can be contained in enclosure 94.

Heat exchange device 10 is positioned on electronic component 24 so heat from electronic component 24 can transfer into a diffuser and a heat sink plate of heat exchange device 10. Heat exchange device 10 pulls in air with a blower, as shown with arrows A. The air then moves through the diffuser and across the heat sink plate to absorb the heat from electronic component 24. The air is then expelled out of the diffuser of heat exchange device 10, as shown with arrows B. Air that is expelled out of heat exchange device 10 can move in all directions in enclosure 94 and can flow over and around electronic components 92, as shown with arrows B. As the air flows over electronic components 92 heat can be exchanged between the air and electronic components 92. Air that has flowed over electronic components 92 can be directed with enclosure 94, as shown with arrows C. Enclosure 94 keeps the air in enclosure 94 and directs the air back towards heat exchange device 10, as shown with arrows C. Heat exchanger 96 is positioned outside of enclosure 94 and allows the air in enclosure 94 to exchange heat with heat exchanger 96 outside of enclosure 94. In alternate embodiments, heat exchanger 96 can be eliminated and the air in enclosure 94 can exchange heat with an ambient outside of enclosure 94 through the walls of enclosure 94. The air in enclosure 94 can circulate through enclosure 94 and then be pulled back into heat exchange device 10 with the blower, as shown with arrows C and A. This creates a closed-loop system in enclosure 94 that allows the air to exchange heat with different components.

Figure 6A:
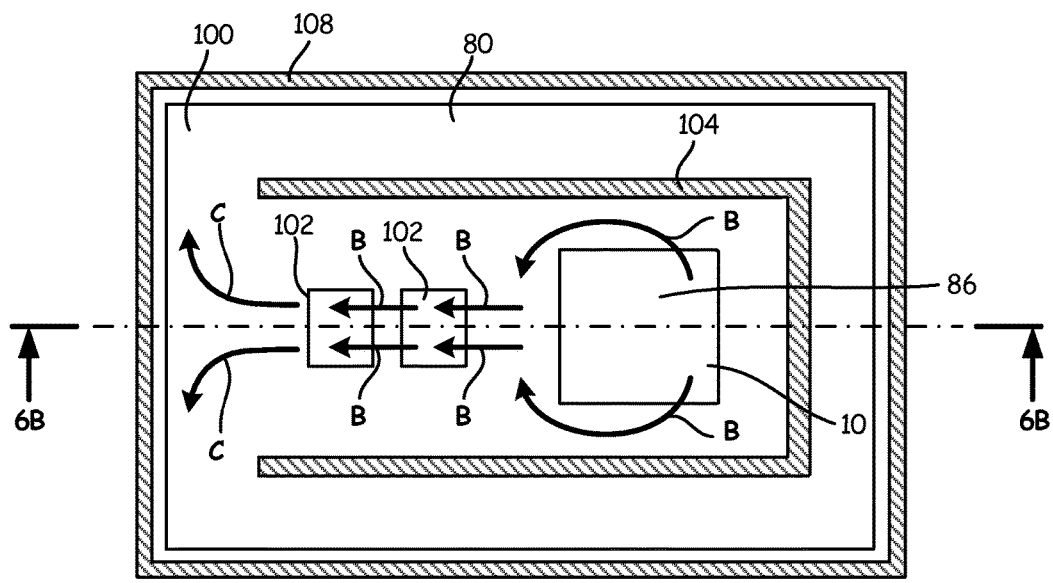
FIG. 6A is a schematic cross-sectional top view of a fifth embodiment of the heat exchange device on an electronic board in an enclosure with walls surrounding the heat exchange device, taken along line 6A-6A of FIG. 6B.
Figure 6B:
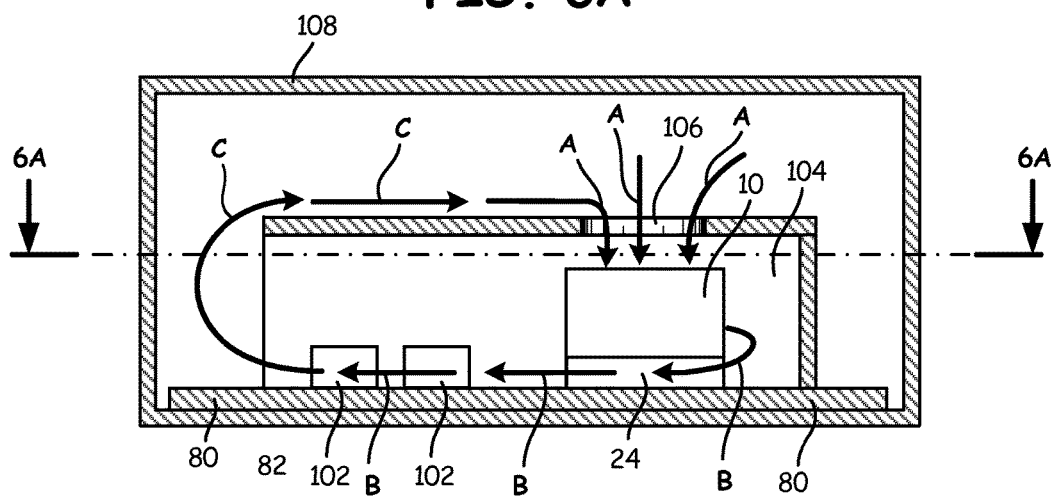
FIG. 6B is a partial schematic cross-sectional side view of the fifth embodiment of the heat exchange device taken along line 6B-6B of FIG. 6A.

FIG. 6A is a schematic cross-sectional top view of a fifth embodiment of the heat exchange device on an electronic board in an enclosure with walls surrounding the heat exchange device, taken along line 6A-6A of FIG. 6B. FIG. 6B is a partial schematic cross-sectional side view of the fifth embodiment of the heat exchange device taken along line 6B-6B of FIG. 6A. FIGS. 6A-6B include heat exchange device 10, electronic component 24, electronic board 100, electronic components 102, walls 104, opening 106, and enclosure 108. Arrows A, B, and C are also drawn in FIGS. 6A-6B to indicate how air flows through the system. Heat exchange device 10, electronic component 24, and electronic components 102 are not shown in section in FIG. 6B.

Heat exchange device 10 is positioned on electronic component 24 to cool electronic component 24. Electronic component 24 is attached to electronic board 100. Electronic components 102 are also attached to electronic board 100 and positioned away from electronic component 24. Walls 104 are also positioned on electronic board 100. Walls 104 surround heat exchange device 10 and electronic component 24 on three sides and extend over heat exchange device 10 and electronic component 24. Electronic components 102 are positioned away from heat exchange device 10 on a fourth side so that there is not a wall between electronic components 102 and heat exchange device 10. Walls 104 will direct air that is expelled from heat exchange device 10 towards electronic components 102. Opening 106 extends through a top portion of walls 104 over heat exchange device 10. Air can flow through opening 106 and into heat exchange device 10. Electronic board 100 with heat exchange device 10, electronic component 24, electronic components 102, walls 104, and opening 106 are held in enclosure 108. Enclosure 108 is a housing that does not have any openings so that a fluid can be contained in enclosure 108.

Heat exchange device 10 is positioned on electronic component 24 so heat from electronic component 24 can transfer into a diffuser and a heat sink plate of heat exchange device 10. Heat exchange device 10 pulls in air with a blower through opening 106 in walls 104, as shown with arrows A. The air then moves through the diffuser and across the heat sink plate to absorb the heat from electronic component 24. The air is then expelled out of the diffuser of heat exchange device 10, as shown with arrows B. Air that is expelled out of heat exchange device 10 will be directed with walls 104, as shown with arrows B. Walls 104 will direct the air toward electronic components 102, as shown with arrows B. The air thus flows over and around electronic components 102, as shown with arrows B. As the air flows over electronic components 102 heat can be exchanged between the air and electronic components 102. Air that has flowed over electronic components 102 can be directed with enclosure 108, as shown with arrows C. Enclosure 108 keeps the air in enclosure 108 and directs the air back towards heat exchange device 10, as shown with arrows C. The air in enclosure 108 can exchange heat with an ambient outside of enclosure 108 through the walls of enclosure 108. The air in enclosure 108 can circulate through enclosure 108 and then be pulled back into heat exchange device 10 with the blower, as shown with arrows C and A. This creates a closed-loop system in enclosure 108 that allows the air to exchange heat with different components.

The embodiments described above in FIGS. 2A-6B are advantageous systems that use the air that is expelled from heat exchange device 10 for a secondary purpose in the system. This allows the systems to be built with fewer fans and other heat exchange devices than was previously necessary in prior art systems. This is advantageous, as it reduces the volume, weight, cost, and complexity of the system compared to prior art systems.

Further, heat exchange device 10 can be designed to ensure that the pressure of the air flowing out of heat exchange device 10 is at a pressure required to flow the air through the system to cool particular electronic components in the system. This allows for greater flexibility in the design of the system while still ensuring that heat can be effectively dissipated out of the system. The system can further include additional electronic components or additional heat exchange devices than those components that are seen in FIGS. 2A-6B. For instance, heat sinks can be positioned on or near the electronic components that are to be cooled and the air from heat exchange device 10 can be directed through the heat sinks to dissipate heat away from the electronic components. Further, any fluid can be directed through the system to exchange heat with the electronic components in the system.

Heat exchange device 10 is advantageous, as it allows heat to be more efficiently and effectively exchanged with a component, such as an electronic component. Heat exchange device 10 outputs air at a high pressure to allow the air to be used for a secondary purpose. This allows the air to be directed through an electronic system to exchange heat with other electronic components. This is advantageous, as it increases heat dissipation in an electronic system without increasing the size, weight, cost, or complexity of the electronic system. Further, innovative electronic components can be used in the electronic system, as heat exchange device 10 can dissipate more heat than prior art heat exchange devices. This allows the electronic system to have better performance and lower power requirements. Directing air flowing out of heat exchange device 10 for another purpose in an electronic system allows the electronic system to operate more effectively and efficiently.

Discussion of Possible Embodiments

The following are non-exclusive descriptions of possible embodiments of the present invention.

A method of cooling a component with a heat exchange device includes pulling air into a central airway in a heat exchange device using a blower, directing the air from the blower through a diffuser and across a heat sink base, and directing the air out from the diffuser and across a second component to cool the second component. A first component positioned underneath the heat sink base is cooled when the air passes over the heat sink base.

The method of the preceding paragraph can optionally include, additionally and/or alternatively, any one or more of the following features, configurations and/or additional components:

Directing the air out from the diffuser and across a second component can include flowing the air through a plenum that extends between the diffuser and the second component.

The method can further include passing the air through a heat exchanger positioned between the plenum and the second component, wherein the heat exchanger is configured to cool the air.

Directing the air out from the diffuser and across a second component can include directing the air across the second component using walls, wherein the walls are positioned to direct the air coming out of the diffuser towards the second component.

The method can further include expelling the air into an ambient.

The method can further include circulating the air through an enclosure and back to the blower.

The method can further include cooling the air with a heat exchanger positioned outside of the enclosure.

A system for cooling electronic components includes a heat exchange device and a structure positioned adjacent the heat exchange device that is configured to direct air flowing out of the heat exchange device over electronic components to cool the electronic components. The heat exchange device includes a blower for pulling fluid into the first heat exchange device, a heat sink base, and a diffuser positioned between the blower and the heat sink base to receive the fluid from the blower. The diffuser has a first plurality of vanes that form fluid flow channels extending spirally outward.

The system of the preceding paragraph can optionally include, additionally and/or alternatively, any one or more of the following features, configurations and/or additional components:

The diffuser further includes a second plurality of vanes in the fluid flow channels defined by the first plurality of vanes that are configured to prevent flow separation.

The system is a plenum with a first end attached to the heat exchange device and a second end positioned adjacent an electronic component.

The system further includes a heat exchanger positioned between the second end of the plenum and the electronic component and configured to cool air flowing through the plenum.

The structure includes a plurality of walls positioned around the heat exchange device to direct air coming out of the heat exchange device toward electronic components to cool the electronic components.

The system further includes an enclosure in which the heat exchange device and the electronic component are positioned.

The enclosure maintains air that can be recirculated through the heat exchange device to form a closed-loop system.

The system further includes a heat exchanger positioned outside of the enclosure and configured to cool air in the enclosure.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of cooling a component with a heat exchange device, the method comprising:
   pulling air into a central airway in the heat exchange device using a blower of the heat exchange device;
   directing the air from the blower through a diffuser of the heat exchange device and across a heat sink base of the heat exchange device, wherein a first component positioned underneath the heat sink base is cooled when the air passes over the heat sink base and wherein the blower and diffuser are positioned above the heat sink base; and
   directing the air out from the diffuser and the heat exchange device and along a path so the air flows across a second component to directly contact and cool the second component, wherein the second component is positioned away from the first component and the heat exchange device and wherein directing the air further comprises:
   flowing the air through a plenum, the plenum comprising:
      a first end that surrounds and is attached to the heat exchange device; and
      a second end that extends between the diffuser and the second component,
   wherein the plenum directs the air to flow in a direction from the first component positioned underneath the heat sink base of the heat exchange device across and around the second component.

2. The method of claim 1, and further comprising:
   passing the air through a heat exchanger positioned between the plenum and the second component, wherein the heat exchanger is configured to cool the air.

3. A method of cooling a component with a heat exchange device, the method comprising:
   pulling air into a central airway in the heat exchange device using a blower of the heat exchange device;
   directing the air from the blower through a diffuser of the heat exchange device and across a heat sink base of the heat exchange device, wherein a first component positioned underneath the heat sink base is cooled when the air passes over the heat sink base and wherein the blower and diffuser are positioned above the heat sink base; and
   directing the air out from the diffuser and the heat exchange device and along a path so the air flows across a second component to directly contact and cool the second component, wherein the second component is positioned away from the first component and the heat exchange device and wherein directing the air out from the diffuser and across the second component further comprises:
   directing the air across the second component using walls, wherein the walls are positioned to direct the air coming out of the diffuser towards the second component, wherein the walls direct the air to flow in a direction from the first component positioned underneath the heat sink base of the heat exchange device across and around the second component.

4. The method of claim 3, and further comprising:
expelling the air from the heat exchange device.

5. The method of claim 3, and further comprising:
circulating the air through an enclosure and back to the blower.

6. The method of claim 5, and further comprising:
cooling the air with a heat exchanger positioned outside of the enclosure.

7. A system for cooling electronic components, the system comprising:
a heat exchange device comprising:
a blower for pulling air into the first heat exchange device;
a heat sink base; and
a diffuser positioned between the blower and the heat sink base to receive the air from the blower, wherein the diffuser has a first plurality of vanes that form fluid flow channels extending spirally outward and wherein the blower and diffuser are positioned above the heat sink base;
a structure positioned adjacent the heat exchange device that is configured to direct the air flowing out of the heat exchange device along a path so the air flows over electronic components to directly contact and cool the electronic components, wherein the electronic components are positioned away from the heat exchange device, wherein the structure is a plenum, the plenum comprising:
a first end that surrounds and is attached to the heat exchange device; and
a second end that extends between the diffuser and a second component,
wherein the plenum directs the air to flow in a direction from a first component positioned underneath the heat sink base of the heat exchange device across and around the second component.

8. The system of claim 7, wherein the diffuser further comprises:
a second plurality of vanes in the fluid flow channels defined by the first plurality of vanes that are configured to prevent flow separation.

9. The system of claim 7, and further comprising:
a heat exchanger positioned between the second end of the plenum and the second component and configured to cool air flowing through the plenum.

10. The system of claim 7, and further comprising:
an enclosure in which the heat exchange device and the second component are positioned.

11. The system of claim 10, wherein the enclosure maintains air that is recirculated through the heat exchange device to form a closed-loop system.

12. The system of claim 10, and further comprising:
a heat exchanger positioned outside of the enclosure and configured to cool air in the enclosure.

* * * * *